(12) United States Patent
Chang et al.

(10) Patent No.: US 11,935,885 B2
(45) Date of Patent: Mar. 19, 2024

(54) DEVICE INCLUDING INTEGRATED ELECTROSTATIC DISCHARGE PROTECTION COMPONENT

(71) Applicant: TAIWAN SEMICONDUCTOR MANUFACTURING CO., LTD., Hsinchu (TW)

(72) Inventors: Tzu-Heng Chang, New Taipei (TW); Kuo-Ji Chen, New Taipei (TW); Ming-Hsiang Song, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/066,060

(22) Filed: Dec. 14, 2022

(65) Prior Publication Data

US 2023/0123887 A1     Apr. 20, 2023

Related U.S. Application Data

(60) Continuation of application No. 16/987,294, filed on Aug. 6, 2020, now Pat. No. 11,557,586, which is a division of application No. 16/105,494, filed on Aug. 20, 2018, now Pat. No. 10,741,543.

(60) Provisional application No. 62/593,072, filed on Nov. 30, 2017.

(51) Int. Cl.
*H01L 27/08*     (2006.01)
*H01L 27/02*     (2006.01)
*H01L 27/088*    (2006.01)

(52) U.S. Cl.
CPC ...... *H01L 27/0274* (2013.01); *H01L 27/0207* (2013.01); *H01L 27/0266* (2013.01); *H01L 27/0292* (2013.01); *H01L 27/0296* (2013.01); *H01L 27/0886* (2013.01)

(58) Field of Classification Search
None
See application file for complete search history.

(56) References Cited

U.S. PATENT DOCUMENTS

| | | | |
|---|---|---|---|
| 6,750,517 B1 * | 6/2004 | Ker ..................... | H01L 29/0696 257/357 |
| 6,849,902 B1 * | 2/2005 | Lin ..................... | H01L 27/0266 257/365 |
| 7,468,617 B1 * | 12/2008 | Sengupta ............ | H01L 27/0266 326/82 |
| 9,530,768 B1 * | 12/2016 | Kim ........................ | H01L 29/78 |

(Continued)

*Primary Examiner* — Bilkis Jahan
(74) *Attorney, Agent, or Firm* — Maschoff Brennan

(57) ABSTRACT

A device includes standard cells in a layout of an integrated circuit. The standard cells include a first standard cell and a second standard cell disposed next to each other. The first standard cell is configured to operate as an electrostatic discharge (ESD) protection circuit and includes a first gate and a second gate. The first gate includes a first gate finger and a second gate finger that are arranged over a first active region, for forming a first transistor and a second transistor, respectively. The second gate is separate from the first gate. The second gate includes a third gate finger and a fourth gate finger that are arranged over a second active region, for forming a third transistor and a fourth transistor, respectively. The first transistor and the second transistor are connected in parallel, and the third transistor and the fourth transistor are connected in parallel.

20 Claims, 6 Drawing Sheets

(56) References Cited

U.S. PATENT DOCUMENTS

| | | |
|---|---|---|
| 2002/0175377 A1 | 11/2002 | Lin |
| 2004/0051146 A1* | 3/2004 | Ker ................. H01L 27/027 257/356 |
| 2004/0164354 A1* | 8/2004 | Mergens ........... H01L 29/4975 257/E29.026 |
| 2006/0091465 A1 | 5/2006 | Chen |
| 2010/0128401 A1 | 5/2010 | Lai |
| 2013/0088800 A1 | 4/2013 | Wang |
| 2013/0298091 A1* | 11/2013 | Lee .................... G06F 30/39 716/102 |
| 2014/0291765 A1* | 10/2014 | Ouyang ............ H01L 27/0277 257/355 |
| 2014/0339601 A1 | 11/2014 | Salcedo |
| 2015/0364465 A1* | 12/2015 | Shimazaki ........ H01L 27/0277 257/401 |
| 2016/0322345 A1* | 11/2016 | Lee .................. H01L 27/0292 |
| 2018/0190645 A1 | 7/2018 | Long |
| 2018/0203311 A1 | 7/2018 | Long |

\* cited by examiner

DEVICE INCLUDING INTEGRATED ELECTROSTATIC DISCHARGE PROTECTION COMPONENT

PRIORITY CLAIM AND CROSS-REFERENCE

This present application is continuation of U.S. application Ser. No. 16/987,294, filed Aug. 6, 2020, which is a divisional application of the U.S. application Ser. No. 16/105,494, filed Aug. 20, 2018, issued as U.S. Pat. No. 10,741,543 on Aug. 11, 2020, which claims priority to U.S. Provisional Application Ser. No. 62/593,072, filed Nov. 30, 2017, all of which are herein incorporated by reference.

BACKGROUND

At input and output nodes of an integrated circuit, a sudden flow of electricity could occur due to a discharge of accumulated static charges, which is the so-called electrostatic discharge (ESD). Because high currents and voltages resulting from electrostatic discharge can easily cause permanent damage to the integrated circuit, adequate protection mechanisms are necessary.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
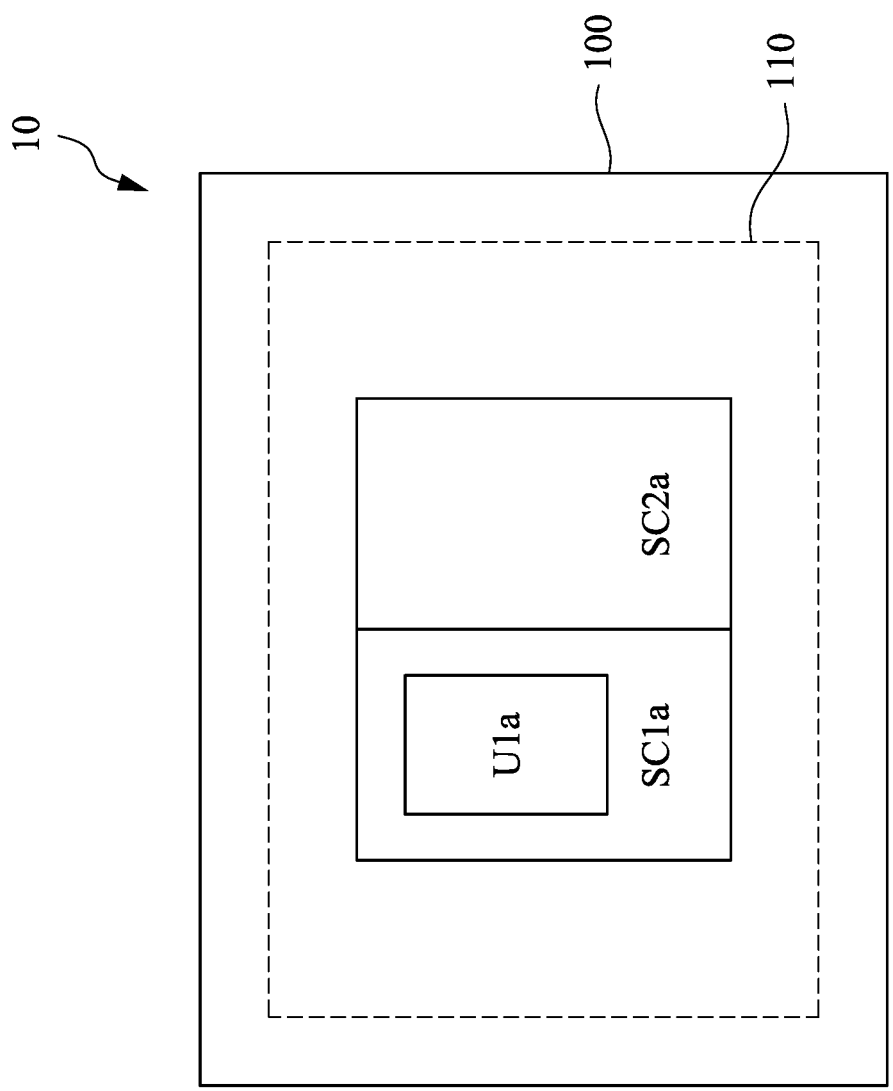
FIG. 1 is a schematic diagram of a device in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

Electrostatic discharge (ESD) events resulting from accumulated static charge normally occur at input and output nodes of an integrated circuit. In some approaches, a diode serving as an ESD protection component is disposed at the input and output nodes, so as to prevent electrical discharge of high current for a short duration. To obey design rules, this solution requires a layout area, sometimes referred to as a keep out zone, placed between the diode and other components of the integrated circuit.

As the dimension of an integrated circuit is scaled down, the increase of a layout area could increase the entire area of the integrated circuit, which is undesirable. To solve such a problem, in some embodiments of the present disclosure, the concept of integrating an ESD component into a standard cell, or abutting an ESD component with a standard cell, is introduced.

Figure 2A:
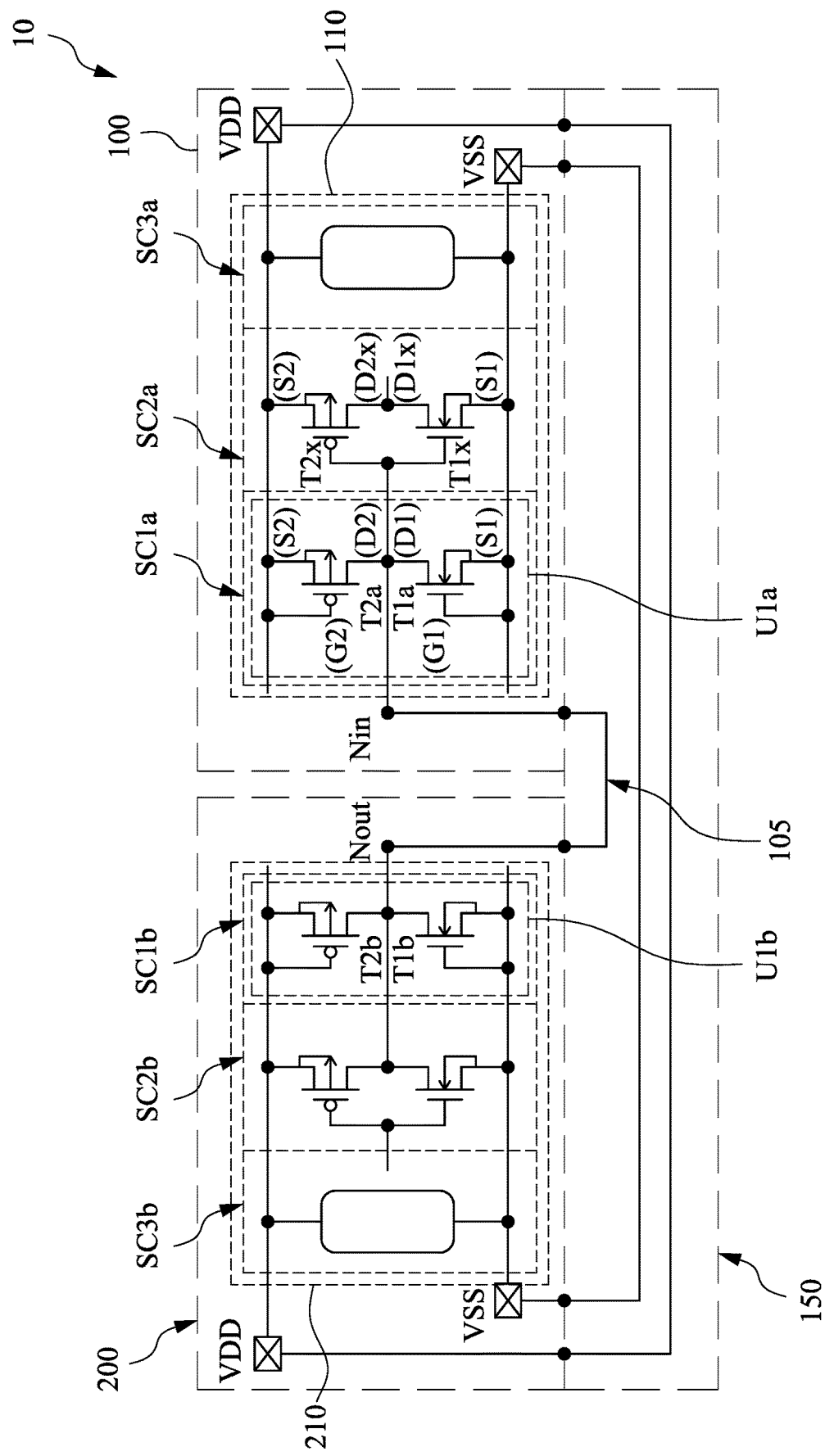
FIG. 2A is a circuit diagram of the device in FIG. 1 in accordance with some embodiments of the present disclosure.

Reference is made to FIGS. 1 and 2A. FIG. 1 is a schematic diagram of a device 10 in accordance with some embodiments of the present disclosure. FIG. 2A is a circuit diagram of the device 10 in FIG. 1 in accordance with some embodiments of the present disclosure. As illustratively shown in FIGS. 1 and 2A, the device 10 includes a die 100 including an integrated circuit 110. The integrated circuit 110 includes a standard cell SC1a. An electrostatic discharge (ESD) protection unit U1a is arranged or integrated in the standard cell SC1a of the integrated circuit 110. For simplicity of illustration, only the die 100 and the integrated circuit 110 therein, in the device 10, are shown in FIG. 1.

For illustration, a standard cell SC2a is also arranged in the integrated circuit 110 of FIG. 1, in addition to the standard cell SC1a. However, the standard cells SC1a and SC2a in FIG. 1 are given for illustrative purposes. Various numbers of standard cells in the integrated circuit 110 are within the contemplated scope of the present disclosure. For example, in various embodiments, there are more than two standard cells, including the standard cell SC1a, the standard cell SC2a, and a standard cell SC3a (as shown in FIG. 2A), arranged in the integrated circuit 110. For another example, the standard cell SC1a and the standard cell SC2 are implemented by a single standard cell, and the ESD protection unit U1a is integrated in the single standard cell.

For illustration in FIG. 1, the ESD protection unit U1a is configured as an element arranged in the standard cell SC1a, and/or integrated with the standard cell SC2a. Alternatively stated with illustration of FIG. 1, in some embodiments, the standard cell SC1a includes several elements/units, including, for illustration, the ESD protection unit U1a which is located inside the standard cell SC1a. For illustration in FIG. 2A, the ESD protection unit U1a is coupled to an input node Nin, to protect the integrated circuit 110 from an ESD event. In some embodiments, the standard cell SC2a includes an inverter including transistors T1x and T2x, which is integrated with and/or abutting the ESD protection unit U1a. In some embodiments, the standard cell SC3a includes a power clamp, as illustrated in FIG. 2A.

In some embodiments, the standard cell SC1a, the standard cell SC2a and the standard cell SC3a are selected from a standard cell library used for the design of the layout of the integrated circuit 110. In some embodiments, the ESD protection unit U1a is already arranged in the standard cell SC1a before the selection of the standard cell SC1a. In some other embodiments, the standard cell SC1a with the ESD protection unit U1a is customized.

In some embodiments, the standard cell library defines various types of standard cells for developing circuit layouts. Each of the standard cells in the standard cell library includes functional circuitry to satisfy its required function. For example, the standard cell SC1a is utilized to discharge accumulated electrostatic charges. In some embodiments, the standard cell library is provided from a storage circuit including, but not limited to, a random-access memory (RAM), a read-only memory (ROM), a flash memory, a hard disk and an optical data storage device, or the like.

In some alternative embodiments, the ESD protection unit U1a of the standard cell SC1a aims at circuit protection while the standard cell SC1a focus on other electronic functions. In other words, apart from the standard cell SC1a, each of the standard cells stored in the standard cell library may include one or more than one specific features.

In some embodiments, the standard cell as discussed above includes logic gates, including, for example, inverters, AND gate, OR gate, NOR gates, NAND gates, and the like. In some embodiments, each logic gate is implemented with metal-oxide-semiconductor field effect transistor technology.

In some embodiments, the standard cell SC1a and the standard cell SC2a directly abut each other, without ESD component in a layout area therebetween, in a layout of the integrated circuit 110. As illustratively shown in FIG. 1, the right edge of the standard cell SC1a and the left edge of the standard cell SC2a are aligned and overlap each other, which means that, for illustration, the standard cell SC1a including the ESD protection unit U1a directly abuts the standard cell SC2a.

The arrangement of the standard cell SC1a and the standard cell SC2a in FIG. 1 is given for illustrative purposes. Various arrangements of the standard cell SC1a and the standard cell SC2a in the integrated circuit 110 are within the contemplated scope of the present disclosure. For example, in various embodiments, the standard cell SC1a and the standard cell SC2a are placed next to each other with additional space inserted.

In some approaches, a diode operated as an ESD protection component is disposed outside a standard cell including at least one component, or is disposed between standard cells. The diode also occupies a layout area, and to obey design rules, there has to be some spacing between the diode and the standard cell. Nevertheless, integrated circuit design rules or other constraints may cause that a diode and other components cannot be closely placed next to each other. Accordingly, the difficulty in routing connection of the diode to other components arises, and the efficiency of circuit layout is reduced.

Compared to the approaches above, design rules normally allow the standard cell SC1a and the standard cell SC2a in the present disclosure to be closely disposed next to each other in the integrated circuit 110. For illustration, the edges of the standard cell SC1a and the standard cell SC2a overlap without design rule violations. Accordingly, an additional layout area, outside the standard cell SC1a and the standard cell SC2a, for the ESD protection unit U1a, is not required.

For illustration in FIG. 2A, in some embodiments, the ESD protection unit U1a includes a transistor T1a and a transistor T2a to implement an ESD protection mechanism configured in the standard cell SC1a. Explained in a different way, the transistor T1a and the transistor T2a are configured in the standard cell SC1a to cooperate as ESD protection components/elements. The transistor T1a and the transistor T2a are connected at the input node Nin which is configured to receive an operation voltage from, for illustration, an integrated circuit 210. The ESD protection unit U1a is disposed, for illustration, next to the input node Nin, so as to discharge a corresponding voltage surge transmitted from the input node Nin. In some embodiments, the transistor T1a and the transistor T2a provide a protection mechanism to avoid the voltage surge passing through, for illustration, the inverter in the standard cell SC2a.

In some embodiments, the operation voltage as discussed above is transmitted to the standard cell SC2a through the input node Nin for the integrated circuit 110 to function accordingly. In some embodiments, the operation voltage is of a value such as 1.8V, 3.3V or 5V depending on the function of the integrated circuit 110. The values of the operation voltage as discussed above are given for illustration purposes. Other values of the operation voltage are within the contemplated scope of the present disclosure.

To protect the inverter in the standard cell SC2a, in some embodiments, the transistor T1a is diode-connected between a reference voltage terminal VSS and the input node Nin. In some other embodiments, the source of the transistor T1a is coupled to the reference voltage terminal VSS, while the drain of the transistor T1a is coupled to the input node Nin. The reference voltage terminal VSS receives a ground voltage in some embodiments. In some alternative embodiments, the gate of the transistor T1a is coupled to the source of the transistor T1a to serve as a grounded-gate n-channel metal-oxide-semiconductor field-effect transistor (GGN-MOS).

Figure 2B:
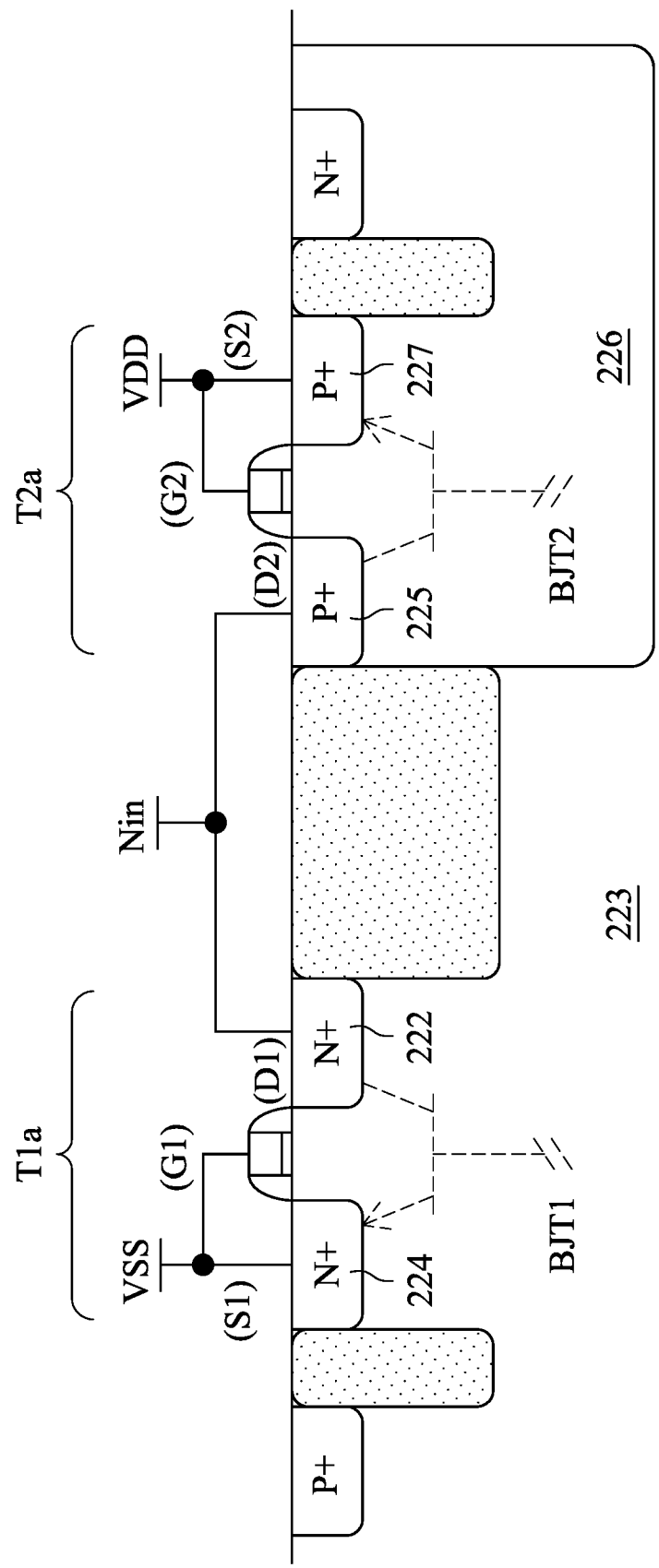
FIG. 2B is a cross sectional view of semiconductor structures of transistors in a standard cell in FIG. 2A, in accordance with some embodiments of the present disclosure.

FIG. 2B is a cross sectional view of semiconductor structures of the transistors T1a and T2a in the standard cell SC1a in FIG. 2A, in accordance with some embodiments of the present disclosure. With respect to the embodiments of FIG. 2A, like elements in FIG. 2B are designated with the same reference numbers for ease of understanding.

For illustration of FIG. 2B with reference to FIG. 2A, as the gate GT1 of the transistor T1a is tied to, for example, ground at the reference voltage terminal VSS, a parasitic bipolar junction transistor BJT1 is formed with respect to the transistor T1a. For illustration, the transistor T1a includes an N type region 222 at its drain D1 and a P type substrate 223, which together form an NP junction to operate as a first parasitic diode. When the input node Nin is subject to the voltage surge, the voltage surge reverse biases the first parasitic diode. Accordingly, a current corresponding to the voltage surge begins to flow through the first parasitic diode. In addition, there is an N type region 224 at the source S1 of the transistor T1a. The N type region 224 together with the P type substrate 223 would form a PN junction to operate as a second parasitic diode. The second parasitic diode between the N type region 224 and P type substrate 223 of the transistor T1a is forward biased. As a result, instead of being sent immediately to the inverter of the standard cell SC2a shown in FIG. 2A, the sudden current caused by the ESD event at the input node Nin is directed through the transistor T1a to be released to ground at the reference voltage terminal VSS, thereby protecting, for illustration, the standard cell SC2a.

On the other hand, for illustration of FIG. 2B with reference to FIG. 2A, a parasitic bipolar junction transistor BJT2 is formed with respect to the transistor T2a. For illustration, the transistor T2a includes a P type region 225 at its drain D2 and an N type well 226, which together form a PN junction to operate as a third parasitic diode. When the input node Nin is subject to the voltage surge, the voltage surge forward biases the third parasitic diode. Accordingly, a current corresponding to the voltage surge begins to flow through the third parasitic diode. In addition, there is a P type region 227 at the source S2 of the transistor T2a. The P type region 227 together with the N type well 226 would form an NP junction to operate as a fourth parasitic diode. The fourth parasitic diode between the P type region 227 and N type well 226 of the transistor T2a is reverse biased. Similarly, instead of being sent immediately to the inverter of the standard cell SC2a shown in FIG. 2A, the sudden current caused by the ESD event at the input node Nin is directed through the transistor T2a to be released, thereby protecting, for illustration, the standard cell SC2a.

In some embodiments, the ESD protection unit U1a is implemented merely using the transistor T1a. In some other embodiments, the ESD protection unit U1a is implemented using at least one transistor, including, for example, the transistor T1a and the transistor T2a within the standard cell SC1a. Accordingly, a safe discharge path is provided for current flows without damaging circuitry such as the standard cell SC2a as shown in FIG. 2A. Similar to the transistor T1a, in some embodiments, the transistor T2a is diode-connected between a second reference voltage terminal VDD and the input node Nin. In some other embodiments, the source of the transistor T2a is coupled to the second reference voltage terminal VDD, while the drain of the transistor T2a is coupled to the input node Nin. In some alternative embodiments, the gate of the transistor T2a is coupled to the source of the transistor T2a to serve as a gate-VDD p-channel metal-oxide-semiconductor field-effect transistor (GDPMOS).

By connecting the transistor T1a and the transistor T2a in series, the ESD protection unit U1a is able to prevent the inverter of the standard cell SC2a from encountering a positive voltage surge and a negative voltage surge.

Figure 2C:
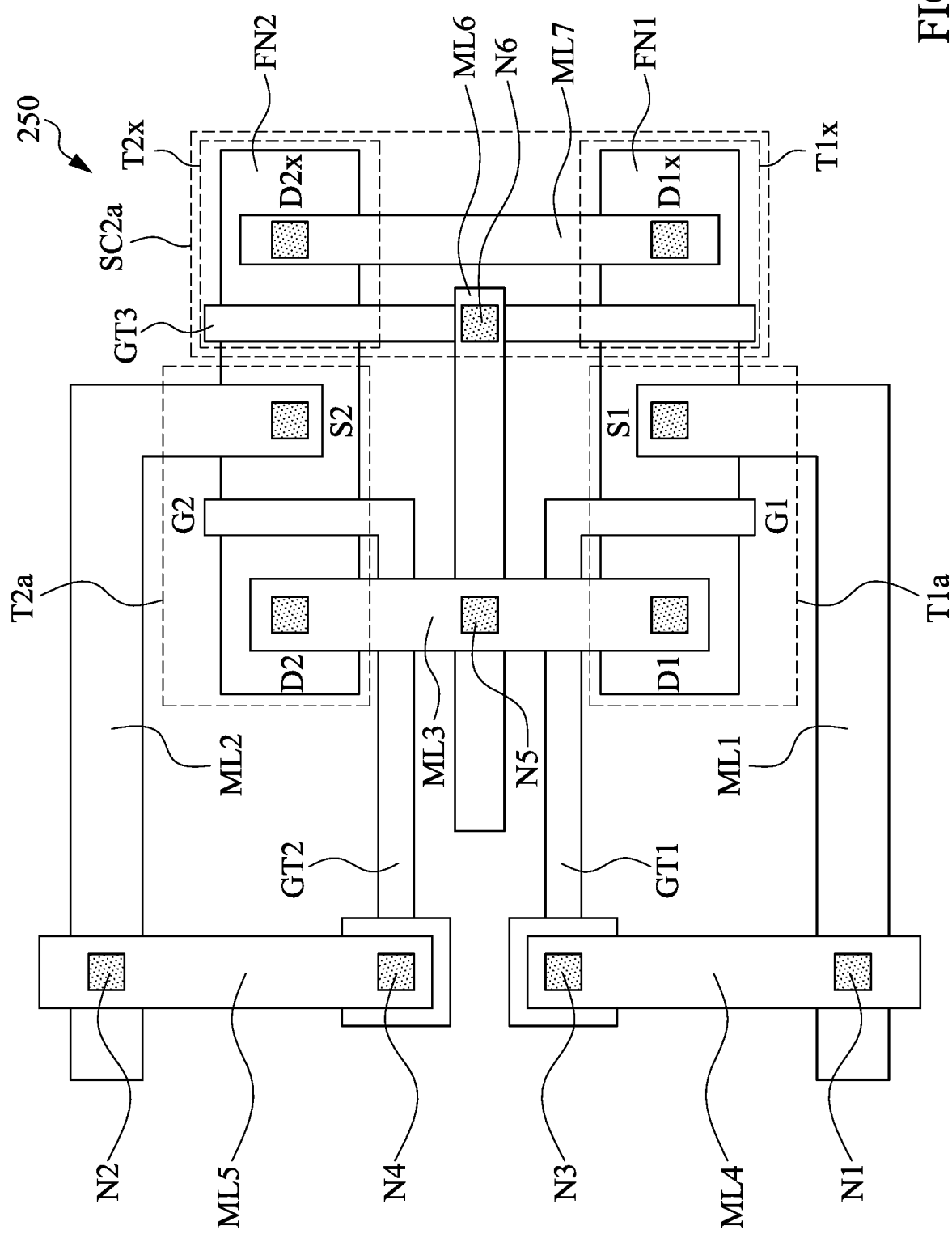
FIG. 2C is a schematic layout of an integrated circuit including structures corresponding to an ESD protection unit within one standard cell and the circuit within the other standard cell in FIG. 2A, in accordance with some embodiments of the present disclosure.

FIG. 2C is a schematic layout 250 of an integrated circuit including structures corresponding to the ESD protection unit U1a within the standard cell SC1a and the circuit within the standard cell SC2a in FIG. 2A, in accordance with some embodiments of the present disclosure. For simplicity of illustration, the schematic layout 250 only shows a portion of structures, and the other portion of structures as can be known by one of ordinary skill in the art is not detailed in FIG. 2C. Moreover, for further simplicity of illustration, discussion for the schematic layout 250 in FIG. 2C is focused on the ESD protection unit U1a together with the circuit within the standard cell SC2a as shown in FIG. 2A, and the other portions of the schematic layout 250 are not further discussed herein.

For illustration in FIG. 2C, the schematic layout 250 includes active regions FN1, FN2, gates GT1, GT2, GT3, and metal lines ML1-ML7. In some embodiments, the active regions FN1 and FN2 include one or more fin structures (not shown) for forming, for example, Fin Field-Effect Transistor (FinFET). In some other embodiments, at least one fin structure is formed on, or formed with, the active region s FN1 and FN2 respectively. In some alternative embodiments, the active regions FN1, FN2 are formed with a planar-type structure. In some embodiments, the active regions FN1, FN2 are formed by using semiconductor material to be, for example, doped regions. In some embodiments, the active regions FN1, FN2 are each formed by using silicon on insulator (SOI) technology. In some embodiments, the gates GT1, GT2, GT3 are implemented by using polysilicon, metal or doped polysilicon.

In some embodiments, each one of the active regions FN1, FN2 has at least one source region and at least one drain region. For illustration in FIG. 2C, the active region FN1 includes source region S1 and drain regions D1, D1x, and the active region FN2 includes source region S2 and drain regions D2, D2x. In terms of the shape of the gates GT1 and GT2, each one of the gates GT1 and GT2 has a stripe across the corresponding active region as illustrated in FIG. 2C. The gates GT1 and GT2 are arranged for forming the transistors T1a and T2a in FIG. 2A.

In some embodiments, the gate GT1 is arranged over the active region FN1. In some embodiments, one source region S1 and one drain region D1 of the active region FN1 are placed at two opposite sides of the corresponding gate GT1, respectively. In some other embodiments, one source region S1 and one drain region D1 are located at two sides of a channel region (not shown) beneath the corresponding gate GT1. In some alternative embodiments, the portion, crossing the active region FN1, of the gate GT1 has one side adjacent to one source region S1 of the active region FN1 and the other side adjacent to one drain region D1 of the active region FN1.

In some embodiments, the gate GT2 is arranged over the active region FN2. In some embodiments, one source region S2 and one drain region D2 of the active region FN2 are placed at two opposite sides of the corresponding gate GT2, respectively. In some other embodiments, one source region S2 and one drain region D2 are located at two sides of a channel region (not shown) beneath the corresponding gate GT2. In some alternative embodiments, the portion, crossing the active region FN2, of the gate GT2 has one side adjacent to one source region S2 of the active region FN2 and the other side adjacent to one drain region D2 of the active region FN2.

For illustration of FIG. 2C with reference to FIG. 2A, the source region S1 and the drain region D1 of the active region FN1 together with the gate GT1 shown in FIG. 2C correspond to the transistor T1*a* shown in FIG. 2A. Correspondingly, the source region S2 and the drain region D2 of the active region FN2 together with the gate GT2 shown in FIG. 2C correspond to the transistor T2*a* shown in FIG. 2A.

In some embodiments, the aforementioned source region is a source doped region, and the aforementioned drain region is a drain doped region. For illustration, the source region S1 and the drain region D1 are doped with n-type dopants, while the source region S2 and the drain region D2 are doped with p-type dopants.

In some embodiments, the metal lines ML1, ML2, ML3 are arranged over the active regions FN1, FN2, and the metal line ML3 is arranged over the gates GT1, GT2. The metal line ML1 is utilized to couple the source region S1 to a node N1, which corresponds to the first reference voltage terminal VSS supplied with, for example, a ground voltage, as shown in FIG. 2A. The gate GT1 is also coupled to the first reference voltage terminal VSS via a node N3, which is coupled to the node N1 though a metal line ML4. The metal line ML2 is utilized to couple the source region S2 to a node N2, which corresponds to the second reference voltage terminal VDD supplied with, for example, a power voltage, as shown in FIG. 2A. The gate GT2 is also coupled to the second reference voltage terminal VDD via a node N4, which is coupled to the node N2 though a metal line ML5. The metal line ML3 is utilized to couple the drain regions D1 and D2 to a node N5, which corresponds to the input node Nin. As a result, the transistor T1*a* and the transistor T2*a* are cascade-connected at the input node Nin between the first reference voltage terminal VSS and the second reference voltage terminal VDD.

With respect to the standard cell SC2*a* in the schematic layout 250, the gate GT3 is arranged across the active regions FN1, FN2, and is arranged for forming the transistors T1*x* and T2*x* as illustrated in FIG. 2A. In some embodiments, one source region S1 and one drain region D1*x* of the active region FN1 are placed at two opposite sides of the corresponding gate GT3, respectively, and one source region S2 and one drain region D2*x* of the active region FN2 are placed at two opposite sides of the corresponding gate GT3, respectively. In some embodiments, the drain region D1*x* is doped with n-type dopants, while the drain region D2*x* is doped with p-type dopants.

For illustration of FIG. 2C with reference to FIG. 2A, the source region S1 and the drain region D1*x* of the active region FN1 together with the gate GT3 shown in FIG. 2C correspond to the transistor T1*x* shown in FIG. 2A. Correspondingly, the source region S2 and the drain region D2*x* of the active region FN2 together with the gate GT3 shown in FIG. 2C correspond to the transistor T2*x* shown in FIG. 2A. For illustration, the transistors T1*a* and T1*x* share the source region S1 used as a common source region, to serve as the configuration of the transistor T1*a* and T1*x* being connected in parallel as shown in FIG. 2A. Correspondingly, the transistors T2*a* and T2*x* share the source region S2 used as a common source region, to serve as the configuration of the transistor T2*a* and T2*x* being connected in parallel as shown in FIG. 2A.

In some embodiments, the metal line ML3 is arranged over and coupled to the metal line ML6 via the node N5. The metal line ML6 is arranged over and coupled to the gate GT3 via a node N6 which also corresponds to the input node Nin shown in FIG. 2A. The metal line ML7 is utilized to couple the drain regions D1*x* and D2*x*. As a result, the transistor T1*x* and the transistor T2*x* are also cascade-connected between the first reference voltage terminal VSS and the second reference voltage terminal VDD, with their gates coupled together to the input node Nin, the drain region D1 of the transistor T1*a*, and the drain region D2 of the transistor T2*a*.

Based on the above, with the schematic layout 250, the transistors T1*a* and T2*a* in the ESD protection unit U1*a* of the standard cell SC1*a* are able to be combined or integrated with the transistors T1*x* and T2*x* of the standard cell SC2*a*. Alternatively stated, the standard cell SC1*a* including the ESD protection unit U1*a* is able to be combined or integrated with the standard cell SC2*a*. Moreover, in the condition that the standard cell SC1*a* and the standard cell SC2*a* are implemented by a single standard cell, as discussed above, the ESD protection unit U1*a* is able to be combined or integrated with circuits, including, for example, the transistors T1*x* and T2*x*, in the single standard cell.

In some embodiments, as illustratively shown in FIG. 2A, the device 10 further includes a die 200 including an integrated circuit 210. In some embodiments, the integrated circuit 210 is disposed within a substrate of the die 200. For illustration, the die 200 has an output node Nout, the die 100 has the input node Nin, and the output node Nout of the die 200 is coupled to the input node Nin of the die 100 through a die-to-die interconnect 105. The die 200 includes a standard cell SC1*b*, a standard cell SC2*b* and a standard cell SC3*b*. In some embodiments, an ESD protection unit U1*b* is arranged in the standard cell SC1*b* of the integrated circuit 210, and includes transistors T1*b* and T2*b*. The transistors T1*b* and T2*b* are configured in the standard cell SC1*b* to cooperate as ESD protection components/elements. In some embodiments, a layout area is configured outside and between the standard cell SC1*a* and the standard cell SC1*b*, and no external electrostatic discharge (ESD) protection component is arranged in this layout area.

The configurations and operations associated with the transistors T1*b* and T2*b* are similar to those associated with the transistors T1*a* and T2*a* as discussed above. Accordingly, they are not further detailed herein.

For illustration, the transistor T1*b* is coupled between the first reference voltage terminal VSS and the output node Nout, and the transistor T2*b* is coupled between the reference voltage terminal VDD and the output node Nout. As discussed above with respect to the transistors T1*a* and T2*a* of the ESD protection unit U1*a*, the transistors T1*b* and T2*b* of the ESD protection unit U1*b* also facilitate ESD current flowing through the desired current path to provide a protection mechanism.

In some approaches, a diode operated as an ESD protection component is disposed outside a standard cell including at least one component, or is disposed between standard cells. The diode also occupies a layout area. To obey design rules, there has to be some spacing between the diode and the standard cell. However, integrated circuit design rules or other constraints may cause that two standard cells cannot be closely placed next to each other because the diode occupies the layout area between these two standard cells.

Compared to the approaches above, the ESD protection unit U1*b* is arranged in the standard cell SC1*b* in some embodiments of the present disclosure, as discussed above. Accordingly, a layout area between, for illustration, the standard cells SC1*b* and SC2*b*, which should originally be occupied by the ESD protection unit U1*b*, is not required.

Without the required layout area between the standard cells SC1b and SC2b, the standard cell SC1b and the standard cell SC2b are able to be closely placed adjacent to each other.

In some embodiments, in addition to the combination or integration of the standard cells SC1a and SC2a, as discussed above with respect to FIG. 2C, the standard cell SC1b including the ESD protection unit U1b is also able to be combined or integrated with the standard cell SC2b, by employing a schematic layout (not shown) corresponding to that illustrated in FIG. 2C. Moreover, in the condition that the standard cell SC1b and the standard cell SC2b are implemented by a single standard cell, the ESD protection unit U1b is able to be combined or integrated with circuits in the single standard cell.

The device 10 is capable of being implemented for meeting a variety of ESD protection requirements. In some embodiments, the ESD protection unit U1a effectively achieves ESD protection for the integrated circuit 110, in particular, for illustration, the standard cell SC2a. In some other embodiments, the ESD protection unit U1b effectively achieves ESD protection for the integrated circuit 210, in particular, for illustration, the standard cell SC2b. Explained in a different way, at least one ESD protection unit is utilized to protect an input node and/or an output node of an integrated circuit.

In some embodiments, the die 100 or the die 200 is an analog die, a digital die, a radio frequency (RF) die, or the like. In some embodiments, the features of the die 100 and the die 200 are integrated in one single die. In some other embodiments, the die 100 and the die 200 are separately produced and built into one single package to provide more diverse functions in one chip.

In some embodiments, the die 100 and the die 200 are mounted on one single plane. For illustration in FIG. 2A, in the realm of 2D (two-dimensional) IC technology, both the die 100 and the die 200 are arranged on a System-in-Package (SiP) substrate 150 using flip-chip technology or wire-bond technology. In some other embodiments, the die 100 and the die 200 are disposed side by side on a silicon interposer (not shown), which has through-silicon vias (not shown) to connect the die 100 and the die 200 to the SiP substrate 150 to fulfill 2.5D IC designs. In some alternative embodiments, the die 100 is stacked on top of the die 200 and interconnected vertically. For illustration in FIG. 2A, the die 100 for 3D IC approach is mounted over the SiP substrate 150, and the die 200 is placed on top of the die 100. The die-to-die interconnect may allow for manufacturing of several products on a single microelectronic substrate, which may lead to improved microelectronic die and/or microelectronic module harvesting and increased product yields.

The configurations of the standard cell SC1a within the device 10 shown in FIG. 1 and FIG. 2A are given for illustrative purposes. Various configurations of the standard cell SC1a are within the contemplated scope of the present disclosure. For example, in various embodiments, a number of transistors are connected in parallel to form or operate equivalently as the transistor T1a or the transistor T2a, or transistors are connected in parallel on a basis of actual requirements to improve ESD protection capabilities, as illustrated in FIG. 3.

Figure 3:
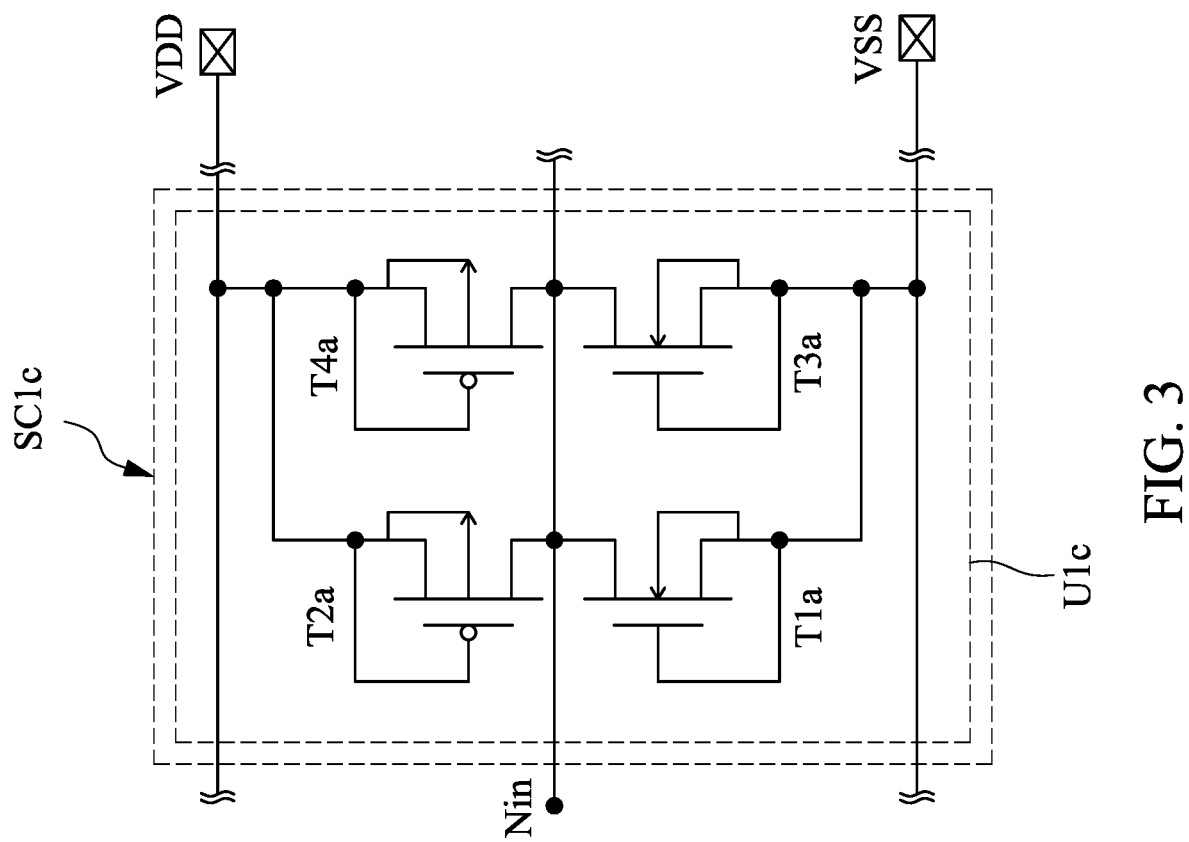
FIG. 3 is an alternative standard cell of the integrated circuit 110 as illustrated in FIG. 1, in accordance with some other embodiments of the present disclosure.

FIG. 3 is a circuit diagram of an alternative standard cell of the integrated circuit 110 as illustrated in FIG. 1, in accordance with some other embodiments of the present disclosure. With respect to the embodiments of FIG. 1 and FIG. 2A, like elements in FIG. 3 are designated with the same reference numbers for ease of understanding. As illustratively shown in FIG. 3, compared to the standard cell SC1a in FIG. 2A, a standard cell SC1c including an ESD protection unit U1c is arranged, and the ESD protection unit U1c includes the transistor T1a and the transistor T2a as discussed above, a transistor T3a, and a transistor T4a. For illustration, the transistor T1a and the transistor T3a are connected in parallel between the first reference voltage terminal VSS and the input node Nin, to share the current equally between them. In some embodiments, the configurations other than the standard cell SC1c are similar to those in the integrated circuit 110 as illustrated in FIG. 2A, and thus they are not further detailed herein for simplicity of illustration.

In some embodiments, because the drain, gate and source of the transistor T3a are connected in a manner as same as that of the transistor T1a, the transistors T1a and T3a together operate as a single transistor in circuitry. Likewise, to ensure equal current sharing, the transistor T2a and the transistor T4a are connected in parallel between the second reference voltage terminal VDD and the input node Nin in some embodiments. In some other embodiments, because the drain, gate and source of the transistor T4a are connected in a manner as same as that of the transistor T2a, the transistors T2a and T4a together operate as a single transistor in circuitry as well.

The number of transistors in the ESD protection unit U1a of FIG. 2A, or in the ESD protection unit U1c of FIG. 3, is given for illustrative purposes. Various numbers of transistors in the ESD protection unit U1a of FIG. 2A, or in the ESD protection unit U1c of FIG. 3, are within the contemplated scope of the present disclosure. For example, to increase the desired ESD protection capability, the number of transistors connected in parallel in the ESD protection unit as discussed above increases.

In some embodiments, the standard cell SC1b in FIG. 2A is also able to be configured to include transistors that are able to be arranged as shown in FIG. 3. Explained in a different way, the standard cell SC1b in FIG. 2A is also able to be configured as same as the standard cell SC1c as illustrated in FIG. 3. Accordingly, the configurations of the standard cells SC1a and SC1b in FIG. 2A are given for illustrative purposes. Various configurations of the standard cells SC1a and SC1b in FIG. 2A are within the contemplated scope of the present disclosure. For example, in various embodiments, one of the standard cells SC1a and SC1b in FIG. 2A is configured to include transistors that are arranged as shown in FIG. 3, and in alternative embodiments, both of the standard cells SC1a and SC1b in FIG. 2A are each configured to include transistors that are arranged as shown in FIG. 3.

Figure 4:
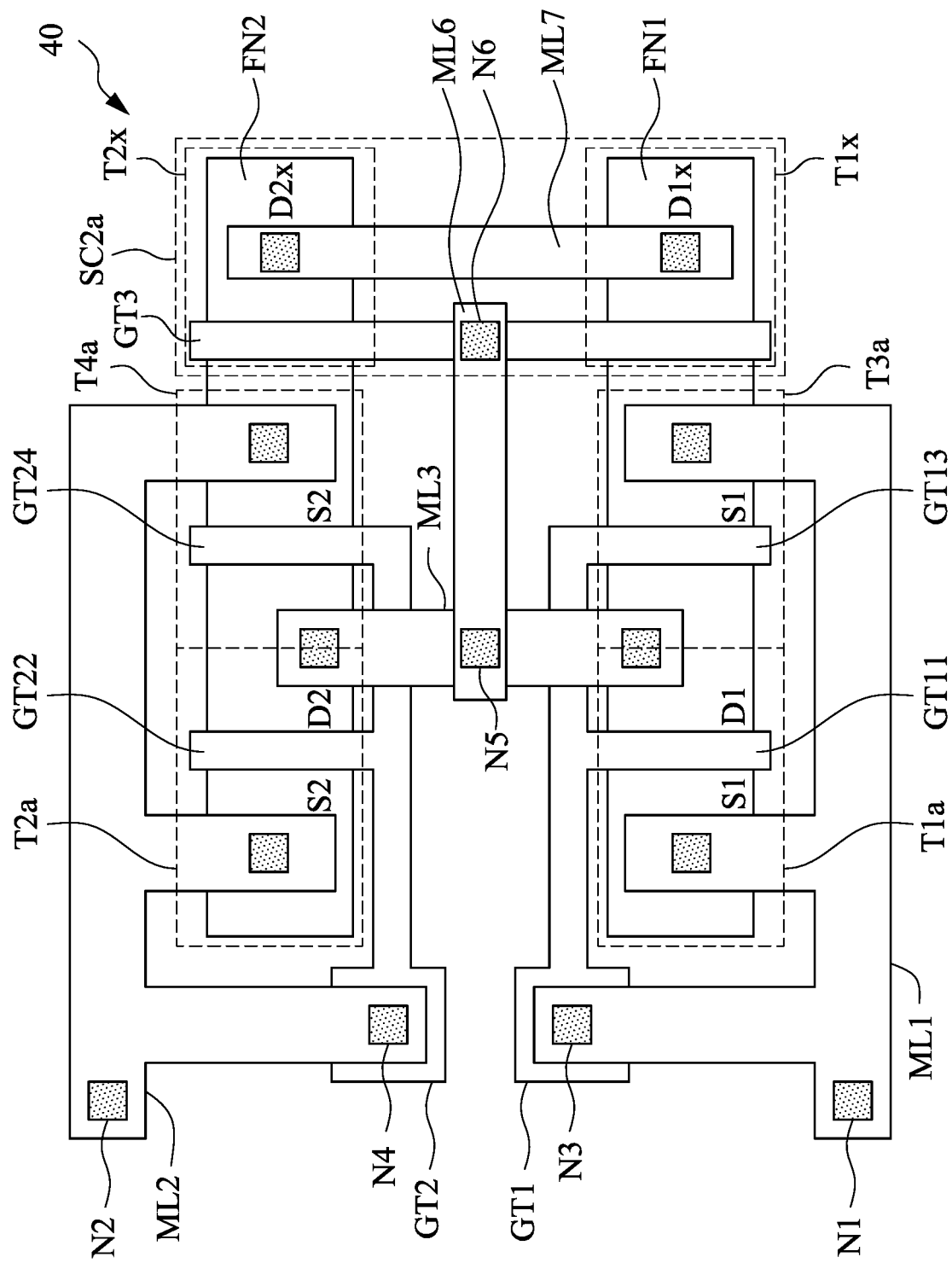
FIG. 4 is a schematic layout of an integrated circuit including structures corresponding to the ESD protection unit within the standard cell in FIG. 3, in accordance with some other embodiments of the present disclosure.

FIG. 4 is a schematic layout 40 of an integrated circuit including structures corresponding to the ESD protection unit U1c within the standard cell SC1c in FIG. 3 and the circuit within the standard cell SC2a in FIG. 2A, in accordance with some embodiments of the present disclosure. For simplicity of illustration, the schematic layout 40 only shows a portion of structures, and the other portion of structures as can be known by one of ordinary skill in the art is not detailed in FIG. 4. Moreover, for further simplicity of illustration, discussion for the schematic layout 40 in FIG. 4 is focused on the ESD protection unit U1c shown in FIG. 3, and the other portions of the schematic layout 40 are not further discussed herein.

For illustration in FIG. 4, the schematic layout 40 includes active regions FN1, FN2, gates GT1, GT2, GT3, and metal lines ML1 to ML3, ML6, and ML7. In some embodiments, the active regions FN1 and FN2 include one or more fin structures (not shown) for forming, for example, Fin Field- Effect Transistor (FinFET). In some other embodiments, at least one fin structure is formed on, or formed with, the active regions FN1 and FN2 respectively. In some alternative embodiments, the active regions FN1, FN2 are formed with a planar-type structure. In some embodiments, the active regions FN1, FN2 are formed by using semiconductor material to be, for example, doped regions. In some embodiments, the active regions FN1, FN2 are each formed by using silicon on insulator (SOI) technology. In some embodiments, the gates GT1, GT2, GT3 are implemented by using polysilicon, metal or doped polysilicon.

In some embodiments, each one of the active regions FN1, FN2 has at least one source region and at least one drain region. For illustration in FIG. 4, the active region FN1 includes source regions S1 and drain region D1, and the active region FN2 includes source regions S2 and drain region D2. In terms of the shape of the gates GT1 and GT2, there are several stripes within the finger-shaped gates GT1 and GT2 to form gate fingers in some embodiments. By increasing the number of the gate fingers, it is capable of creating transistors in parallel connection. For illustration in FIG. 4, the gate GT1 includes three gate fingers, and the gate GT2 includes three gate fingers. The gate fingers GT11 and GT13 are arranged for forming the transistors T1a and T3a in FIG. 3, and the gate fingers GT22 and GT24 are arranged for forming the transistors T2a and T4a in FIG. 3.

In some embodiments, the gate GT1 is arranged over the active region FN1. In some embodiments, one source region S1 and one drain region D1 of the active region FN1 are placed at two opposite sides of one corresponding gate finger of the gate GT1, respectively. In some other embodiments, one source region S1 and one drain region D1 are located at two sides of a channel region (not shown) beneath one corresponding gate finger of the gate GT1. In some alternative embodiments, each gate finger of the gate GT1 has one side adjacent to one source region S1 of the active region FN1 and the other side adjacent to one drain region D1 of the active region FN1.

For illustration of FIG. 4 with reference to FIG. 3, the source region S1 and the drain region D1 of the active region FN1 together with the gate finger GT11 of the gate GT1 shown in FIG. 4 correspond to the transistor T1a shown in FIG. 3. The source region S1 and the drain region D1 of the active region FN1 together with the gate finger GT13 of the gate GT1 shown in FIG. 4 correspond to the transistor T3a shown in FIG. 3. Correspondingly, the source region S2 and the drain region D2 of the active region FN2 together with the gate finger GT22 of the gate GT2 shown in FIG. 4 correspond to the transistor T2a shown in FIG. 3. The source region S2 and the drain region D2 of the active region FN2 together with the gate finger GT24 of the gate GT2 shown in FIG. 4 correspond to the transistor T4a shown in FIG. 3.

In some embodiments, two transistors share a common drain region D1 or a common source region S1. For illustration in FIG. 4, the transistor T1a and the transistor T3a share the common drain region D1, to serve as the configuration of the transistor T1a and the transistor T3a being connected in parallel as shown in FIG. 3. Correspondingly, the transistor T2a and the transistor T4a share the common drain region D2, to serve as the configuration of the transistor T2a and the transistor T4a being connected in parallel as shown in FIG. 3.

In some embodiments, the source regions S1 are source doped region, and the drain region D1 is a drain doped region. For illustration, the source regions S1 and the drain region D1 are doped with n-type dopants, while the source region S2 and the drain region D2 are doped with p-type dopants.

In some embodiments, the gate GT2 is arranged over the active region FN2. In some embodiments, one source region S2 and one drain region D2 of the active region FN2 are placed at two opposite sides of one corresponding gate finger of the gate GT2, respectively. In some other embodiments, one source region S2 and one drain region D2 are located at two sides of a channel region (not shown) beneath one corresponding gate finger of the gate GT2.

In some embodiments, one gate finger of the gate GT1, a channel region (not shown) beneath the gate finger, and the source region S1 and drain region D1 on two opposite sides of the gate finger, form a transistor such as the transistor T1a or the transistor T3a. In such embodiments, the gate GT1, the source region S1 and the drain regions D1 serve as a gate end, a source end, and a drain end of a transistor, respectively.

In some embodiments, one gate finger of the gate GT2, a channel region (not shown) beneath the gate finger, and the source region S2 and drain regions D2 on two opposite sides of the gate finger, form a transistor such as the transistor T2a or the transistor T4a. In such embodiments, the gate GT2, the source region S2 and the drain regions D2 serve as a gate end, a source end, and a drain end of a transistor, respectively.

In some embodiments, the metal lines ML1 to ML3 are arranged over the active regions FN1, FN2 and the gates GT1, GT2. The metal line ML1 is utilized to couple the source regions S1 to the node N1, which corresponds to the first reference voltage terminal VSS supplied with, for example, a ground voltage, as shown in FIG. 3. The gate finger of the gates GT1 are also coupled to the first reference voltage terminal VSS via the node N3, which is coupled to the node N1 though the metal line ML1. The metal line ML2 is utilized to couple the source regions S2 to the node N2, which corresponds to the second reference voltage terminal VDD supplied with, for example, a power voltage, as shown in FIG. 3. The gate finger of the gates GT2 are also coupled to the second reference voltage terminal VDD via the node N4, which is coupled to the node N2 though the metal line ML2. The metal line ML3 is utilized to couple the drain regions D1 and D2 to the node N5, which corresponds to the input node Nin. As a result, the transistor T1a and the transistor T3a are connected in parallel between the first reference voltage terminal VSS and the input node Nin to share the total current equally between them. The transistor T2a and the transistor T4a are connected in parallel between the second reference voltage terminal VDD and the input node Nin so as to ensure equal current sharing.

With respect to the standard cell SC2a in the schematic layout 40, the layout structure of the standard cell SC2a is the same as the layout structure as discussed above for illustration in FIG. 2C, and thus it is not further detailed herein. Compared to FIG. 2C, for illustration in FIG. 4, the transistor T3a of FIG. 3 and the transistor T1x of FIG. 2A share the source region S1 used as a common source region, to serve as the configuration of the transistor T3a and T1x being connected in parallel. Correspondingly, the transistor T4a of FIG. 3 and the transistor T2x of FIG. 2A share the source region S2 used as a common source region, to serve as the configuration of the transistor T4a and T2x being connected in parallel.

Based on the embodiments of FIG. 4, with the schematic layout 40, the transistors T1a-T4a in the ESD protection unit U1c of the standard cell SC1c of FIG. 3 are able to be combined or integrated with the transistors T1x and T2x of the standard cell SC2a of FIG. 2C. Alternatively stated, the standard cell SC1c including the ESD protection unit U1c of FIG. 3 is able to be combined or integrated with the standard cell SC2a of FIG. 2C. Moreover, in the condition that the standard cell SC1c and the standard cell SC2a are implemented by a single standard cell, the ESD protection unit U1c is able to be combined or integrated with circuits, including, for example, the transistors T1x and T2x, in the single standard cell.

The schematic layout 250 and the schematic layout 40 as discussed above are designed and manufactured in a variety of methods in some embodiments. The methods may be executed by a processing circuit including, but not limited to, a computer, a digital signal processor, a micro controller, and a microprocessor.

With respect to the design and fabrication of the device 10 in FIG. 1 and FIG. 2A, operations are discussed below. First, the displacement of the standard cell SC1a, the standard cell SC2a and the standard cell SC3a is determined. In some embodiments, the displacement is checked and conflicts (if any) are resolved in this stage so that neighboring standard cells may not be too close to each other. As discussed above, the standard cell SC1a abuts the standard cell SC2a without a layout area therebetween for ESD component to occupy, in the layout. While a layout area could be avoided by requiring that the standard cell SC1a abuts the standard cell SC2a to be closely disposed, the layout area which is originally arranged for the ESD protection unit U1a is not required. Accordingly, arranging the ESD protection unit U1a in the standard cell SC1a not only protects the integrated circuit 110 but also allows the ESD protection unit U1a to be designed and/or formed within the standard cell SC1a, without increasing the area of the integrated circuit 110. For illustration, the ESD protection unit U1a is integrated and/or abutted with other components (not shown) in the standard cell SC1a.

After the standard cell SC1a and the standard cell SC2a are arranged, the connections therebetween are determined in routing process. In some embodiments, the standard cell SC1a and the standard cell SC2a may be coupled according to functional relationships of the components within the standard cell SC1a and the standard cell SC2a. In some embodiments, the placement and routing of the standard cell SC1a and the standard cell SC2a are then verified with design rules to check if the layout of the integrated circuit 110 complies with the design rules, which govern how the integrated circuit 110 should be fabricated.

Then, the fabrication of the integrated circuit 110 as discussed above is initiated. To fabricate the integrated circuit 110, corresponding device manufacture processes may be performed in sequence. Particularly, in some embodiments, the integrated circuit 110 is formed with a stack of several layers. Each layer is overlaid on a prior layer and lithographically patterned to, for example, define the shapes of the components within the integrated circuit 110. The gates GT1 and GT2 of the ESD protection unit U1a within the standard cell SC1a and a gate within the standard cell SC2a are formed from one single gate layer. Moreover, as the lithography is carried out, it requires the same mask or the same mask set to form the gates GT1 and GT2 of the ESD protection unit U1a and the gate of the standard cell SC2a.

Also disclosed is a device that includes a plurality of standard cells in a layout of an integrated circuit. The standard cells include a first standard cell and a second standard cell disposed next to each other. The first standard cell is configured to operate as an electrostatic discharge (ESD) protection circuit and includes a first gate and a second gate. The first gate includes a first gate finger and a second gate finger that are arranged over a first active region, for forming a first transistor and a second transistor, respectively. The second gate is separate from the first gate. The second gate includes a third gate finger and a fourth gate finger that are arranged over a second active region, for forming a third transistor and a fourth transistor, respectively. The first transistor and the second transistor are connected in parallel, and the third transistor and the fourth transistor are connected in parallel.

In some embodiments, the first transistor and the third transistor are coupled in series, and the second transistor and the fourth transistor are coupled in series.

In some embodiments, the device further includes a first metal line and a second metal line. The first metal line is arranged to couple first source/drain regions of the first active region, which are arranged for forming the first transistor and the second transistor, respectively, to a first reference voltage terminal. The second metal line is arranged to couple first source/drain regions of the second active region, which are arranged for forming the third transistor and the fourth transistor, respectively, to a second reference voltage terminal.

In some embodiments, the device further includes a third metal line arranged to couple a second source/drain region of the first active region to a second source/drain region of the second active region. The second source/drain region of the first active region is shared by the first transistor and the second transistor, and the second source/drain region of the second active region is shared by the third transistor and the fourth transistor.

In some embodiments, the device further includes a fourth metal line arranged to couple a third gate with the third metal line.

In some embodiments, the device further includes a third metal line separate from the first metal line and the second metal line with respect to a third gate, the third metal line arranged to couple a second source/drain region of the first active region with a second source/drain region of the second active region.

In some embodiments, the first gate finger and the second gate finger are coupled to the first reference voltage terminal, and the third gate finger and the fourth gate finger are coupled to the second reference voltage terminal, such that each one of the first to fourth transistors is diode-connected.

Also disclosed is a device that includes an integrated circuit including a standard cell that is selected from a standard cell library used for design of a layout of the integrated circuit. The standard cell includes a first comb-shaped gate, a second gate, a first metal line, and a second metal line. The first comb-shaped gate is for formation of a first transistor and a second transistor, respectively, included in an electrostatic discharge (ESD) protection component. The second gate is separate from the first comb-shaped gate for formation of a third transistor that is connected to the second transistor with sharing a first source/drain region. The first metal line is connected to the second gate. The second metal line is connected to the first metal line and coupled a second source/drain region to an input node.

In some embodiments, the second source/drain region and a third source/drain region are placed at two opposite sides of a first gate finger of the first comb-shaped gate. The second source/drain region and the first source/drain region are placed at two opposite sides of a second gate finger of the first comb-shaped gate.

In some embodiments, the first gate finger, the second source/drain region and the third source/drain region together correspond to the first transistor. The second gate finger, the second source/drain region and the first source/drain region together correspond to the second transistor. The first transistor and the second transistor are connected in parallel.

In some embodiments, the device further includes a third metal line. The third metal line is arranged to couple the first source/drain region and the third source/drain region together to a reference voltage terminal.

In some embodiments, the standard cell further includes a third comb-shaped gate. The third gate is separate from the first comb-shaped gate and the second gate. The third comb-shaped gate is for formation of a fourth transistor and a fifth transistor, respectively, included in the ESD protection component. The second gate is further for formation of a sixth transistor that is connected to the fifth transistor with sharing a third source/drain region.

In some embodiments, a fourth source/drain region and a fifth source/drain region are placed at two opposite sides of a third gate finger of the third comb-shaped gate.

In some embodiments, the fourth source/drain region and a sixth source/drain region are placed at two opposite sides of a fourth gate finger of the third comb-shaped gate.

Also disclosed is a device that includes an integrated circuit including a standard cell. The standard cell is selected for design of a layout of the integrated circuit and includes a first active region, a second active region, a first gate finger, a second gate finger, a third gate finger, and a fourth gate finger. The first active region includes a first source/drain region, a second source/drain region, and a third source/drain region. The second active region is separate from the first active region and includes a fourth source/drain region, a fifth source/drain region, and a sixth source/drain region. The first gate finger is arranged between the first source/drain region and the second source/drain region. The second gate finger is arranged between the second source/drain region and the third source/drain region. The third gate finger is arranged between the fourth source/drain region and the fifth source/drain region. The fourth gate finger is arranged between the fifth source/drain region and the sixth source/drain region. The first gate finger is configured to form a first transistor of an electrostatic discharge (ESD) protection circuit, the third gate finger is configured to form a second transistor of the ESD protection circuit, and the second transistor is connected to the first transistor in series.

In some embodiments, the standard cell further includes a second gate. One end of the second gate is arranged between the third source/drain region and a seventh source/drain region. Other end of the second gate is arranged between the sixth source/drain region and an eighth source/drain region. The second gate, the sixth source/drain region and the eighth source/drain region together are configured to form a third transistor that is connected to the second transistor.

In some embodiments, the second gate, the third source/drain region and the seventh source/drain region together are configured to form a fourth transistor that is connected to the first transistor.

In some embodiments, the first transistor and the second transistor are coupled to an input node.

In some embodiments, the third transistor and the fourth transistor are coupled to the input node.

In some embodiments, a type of the first transistor is different from a type of the second transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a plurality of standard cells in a layout of an integrated circuit, the plurality of standard cells comprising a first standard cell and a second standard cell disposed next to each other,
wherein the first standard cell is configured to operate as an electrostatic discharge (ESD) protection circuit and comprises:
a first gate including a first gate finger and a second gate finger that are arranged over a first active region, for forming a first transistor and a second transistor, respectively; and
a second gate separate from the first gate, the second gate including a third gate finger and a fourth gate finger that are arranged over a second active region, for forming a third transistor and a fourth transistor, respectively,
wherein the first transistor and the second transistor are connected in parallel, and the third transistor and the fourth transistor are connected in parallel.

2. The device of claim 1, wherein the first transistor and the third transistor are coupled in series, and the second transistor and the fourth transistor are coupled in series.

3. The device of claim 1, further comprising:
a first metal line arranged to couple first source/drain regions of the first active region, which are arranged for forming the first transistor and the second transistor, respectively, to a first reference voltage terminal; and
a second metal line arranged to couple first source/drain regions of the second active region, which are arranged for forming the third transistor and the fourth transistor, respectively, to a second reference voltage terminal.

4. The device of claim 3, further comprising:
a third metal line arranged to couple a second source/drain region of the first active region to a second source/drain region of the second active region,
wherein the second source/drain region of the first active region is shared by the first transistor and the second transistor, and the second source/drain region of the second active region is shared by the third transistor and the fourth transistor.

5. The device of claim 4, further comprising:
a fourth metal line arranged to couple a third gate with the third metal line.

6. The device of claim 3, further comprising:
a third metal line separate from the first metal line and the second metal line with respect to a third gate, the third metal line arranged to couple a second source/drain region of the first active region with a second source/drain region of the second active region.

7. The device of claim 3, wherein the first gate finger and the second gate finger are coupled to the first reference voltage terminal, and the third gate finger and the fourth gate finger are coupled to the second reference voltage terminal, such that each one of the first to fourth transistors is diode-connected.

8. A device, comprising:
an integrated circuit comprising a standard cell that is selected from a standard cell library used for design of a layout of the integrated circuit, the standard cell comprising:
a first comb-shaped gate for formation of a first transistor and a second transistor, respectively, included in an electrostatic discharge (ESD) protection component;
a second gate separate from the first comb-shaped gate for formation of a third transistor that is connected to the second transistor with sharing a first source/drain region,
a first metal line connected to the second gate; and
a second metal line connected to the first metal line and coupled a second source/drain region to an input node.

9. The device of claim 8, wherein
the second source/drain region and a third source/drain region are placed at two opposite sides of a first gate finger of the first comb-shaped gate, and
the second source/drain region and the first source/drain region are placed at two opposite sides of a second gate finger of the first comb-shaped gate.

10. The device of claim 9, wherein
the first gate finger, the second source/drain region and the third source/drain region together correspond to the first transistor,
the second gate finger, the second source/drain region and the first source/drain region together correspond to the second transistor, and
the first transistor and the second transistor are connected in parallel.

11. The device of claim 9, further comprising:
a third metal line arranged to couple the first source/drain region and the third source/drain region together to a reference voltage terminal.

12. The device of claim 8, wherein the standard cell further comprises:
a third comb-shaped gate separate from the first comb-shaped gate and the second gate,
wherein the third comb-shaped gate for formation of a fourth transistor and a fifth transistor, respectively, included in the ESD protection component, and
the second gate is further for formation of a sixth transistor that is connected to the fifth transistor with sharing a third source/drain region.

13. The device of claim 12, wherein
a fourth source/drain region and a fifth source/drain region are placed at two opposite sides of a third gate finger of the third comb-shaped gate.

14. The device of claim 13, wherein
the fourth source/drain region and a sixth source/drain region are placed at two opposite sides of a fourth gate finger of the third comb-shaped gate.

15. A device, comprising:
an integrated circuit comprising a standard cell, wherein the standard cell is selected for design of a layout of the integrated circuit, the standard cell comprising:
a first active region comprising a first source/drain region, a second source/drain region, a third source/drain region;
a second active region separate from the first active region comprising a fourth source/drain region, a fifth source/drain region, and a sixth source/drain region;
a first gate finger arranged between the first source/drain region and the second source/drain region;
a second gate finger arranged between the second source/drain region and the third source/drain region;
a third gate finger arranged between the fourth source/drain region and the fifth source/drain region; and
a fourth gate finger arranged between the fifth source/drain region and the sixth source/drain region,
wherein the first gate finger is configured to form a first transistor of an electrostatic discharge (ESD) protection circuit, the third gate finger is configured to form a second transistor of the ESD protection circuit, and the second transistor is connected to the first transistor in series.

16. The device of claim 15, wherein the standard cell further comprises:
a second gate, wherein one end of the second gate is arranged between the third source/drain region and a seventh source/drain region,
other end of the second gate is arranged between the sixth source/drain region and an eighth source/drain region, and
the second gate, the sixth source/drain region and the eighth source/drain region together are configured to form a third transistor that is connected to the second transistor.

17. The device of claim 16, wherein the second gate, the third source/drain region and the seventh source/drain region together are configured to form a fourth transistor that is connected to the first transistor.

18. The device of claim 17, wherein the first transistor and the second transistor are coupled to an input node.

19. The device of claim 18, wherein the third transistor and the fourth transistor are coupled to the input node.

20. The device of claim 15, wherein a type of the first transistor is different from a type of the second transistor.

* * * * *